United States Patent
Li et al.

(10) Patent No.: US 10,566,399 B2
(45) Date of Patent: Feb. 18, 2020

(54) DISPLAY SUBSTRATE AND METHOD FOR MANUFACTURING THE SAME, AND DISPLAY DEVICE

(71) Applicant: BOE TECHNOLOGY GROUP CO., LTD., Beijing (CN)

(72) Inventors: Xiaolong Li, Beijing (CN); Yi Li, Beijing (CN); Xiaowei Xu, Beijing (CN); Zheng Liu, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 15/737,191

(22) PCT Filed: Jun. 29, 2017

(86) PCT No.: PCT/CN2017/090822
§ 371 (c)(1),
(2) Date: Dec. 15, 2017

(87) PCT Pub. No.: WO2018/045799
PCT Pub. Date: Mar. 15, 2018

(65) Prior Publication Data
US 2018/0374908 A1 Dec. 27, 2018

(30) Foreign Application Priority Data
Sep. 6, 2016 (CN) .......................... 2016 1 0805295

(51) Int. Cl.
*H01L 29/08* (2006.01)
*H01L 27/32* (2006.01)

(52) U.S. Cl.
CPC ........ *H01L 27/326* (2013.01); *H01L 27/3206* (2013.01); *H01L 27/3272* (2013.01)

(58) Field of Classification Search
CPC ..................................................... H01L 27/326
(Continued)

(56) References Cited

U.S. PATENT DOCUMENTS 5,294,869 A 3/1994 Tang et al.
2007/0122718 A1* 5/2007 Mizusako ........ B29D 11/00365
430/5

(Continued)

FOREIGN PATENT DOCUMENTS

CN 1874000 A * 12/2006
CN 1874000 A 12/2006
(Continued)

OTHER PUBLICATIONS

First Chinese Office Action, for Chinese Patent Application No. 201610805295.9, dated Jul. 17, 2017, 12 pages.
(Continued)

*Primary Examiner* — Ajay Arora
(74) *Attorney, Agent, or Firm* — Kinney & Lange, P.A.

(57) ABSTRACT

A display substrate, a method for manufacturing the same, a display panel and a display device are disclosed. The display substrate includes a pixel unit, and the pixel unit includes a light emitting layer and a pixel definition layer surrounding the light emitting layer. The pixel definition layer includes a first region and a second region. The first region has a first thickness, the second region has a second thickness. The first thickness is greater than the second thickness.

17 Claims, 5 Drawing Sheets

(58) Field of Classification Search
USPC .......................................................... 257/40
See application file for complete search history.

(56) References Cited

U.S. PATENT DOCUMENTS

2015/0004375 A1* 1/2015 Hou .................... H01L 27/3246
428/195.1
2016/0133675 A1* 5/2016 Yata .................... H01L 27/3218
257/89
2017/0141350 A1* 5/2017 Wang ...................... H01L 51/56

FOREIGN PATENT DOCUMENTS

| CN | 101168834 A | 4/2008 |
| CN | 103378126 A | 10/2013 |
| CN | 104465671 A | 3/2015 |
| CN | 104659069 A | 5/2015 |
| CN | 105870158 A | 8/2016 |
| CN | 106373982 A | 2/2017 |
| EP | 1916726 A2 | 4/2008 |

OTHER PUBLICATIONS

International Search Report & English Translation of Box V of the Written Opinion, for PCT Patent Application No. PCT/CN2017/090822, dated Sep. 8, 2017, 20 pages.
Chinese Search Report, for Chinese Patent Application No. 201610805295.9, dated Apr. 27, 2017, 16 pages.

* cited by examiner

DISPLAY SUBSTRATE AND METHOD FOR MANUFACTURING THE SAME, AND DISPLAY DEVICE

CROSS-REFERENCE TO RELATED APPLICATION

This application is a Section 371 National Stage Application of International Application No. PCT/CN2017/090822, filed on Jun. 29, 2017, entitled "DISPLAY SUBSTRATE AND METHOD FOR MANUFACTURING THE SAME, AND DISPLAY DEVICE", which claims priority to Chinese Patent Application No. 201610805295.9 filed on Sep. 6, 2016 with SIPO, incorporated herein by reference in entirety.

BACKGROUND

Technical Field

Embodiments of the present disclosure relate to a field of display technology, and more particularly, to a display substrate and a method for manufacturing the same, and a display device.

Description of the Related Art

In recent years, organic light emitting panels are widely used. During manufacturing an organic light emitting panel, it is necessary to vapor-deposit a light emitting material. In the conventional method, a vapor deposition is performed using a fine metal mask (FMM). If a fine metal mask is used, there is a problem that the mask has an expensive production cost and the mask is easily deformed by gravity to cause color mixing.

SUMMARY

The embodiments of the present disclosure provide a display substrate, a method for manufacturing the display substrate, a display panel and a display device.

According to a first aspect of the present disclosure, there is provided a display substrate, comprising a pixel unit, wherein the pixel unit comprises a light emitting layer and a pixel definition layer surrounding the light emitting layer; and wherein the pixel definition layer comprises a first region and a second region, the first region has a first thickness, the second region has a second thickness, and the first thickness is greater than the second thickness.

In an embodiment of the present disclosure, the first region and the second region are configured to selectively shield a vapor deposition material during formation of the light emitting layer by a vapor deposition process so that the light emitting layer has a predetermined shape.

In an embodiment of the present disclosure, the pixel unit comprises a plurality of sub-pixels, the light emitting layer comprises a plurality of portions respectively provided in the plurality of sub-pixels; and the pixel definition layer further comprises a third region located between two adjacent sub-pixels, the third region has a third thickness, and the third thickness is less than the first thickness and less than the second thickness.

In an embodiment of the present disclosure, the first region, the second region and the third region are configured to selectively shield a vapor deposition material during formation of the light emitting layer by a vapor deposition process, to respectively form the portions of the light emitting layer.

In an embodiment of the present disclosure, the pixel unit comprises a first sub-pixel, a second sub-pixel and a third sub-pixel, the first sub-pixel is arranged in a column, and the second sub-pixel and the third sub-pixel are arranged in another column.

In an embodiment of the present disclosure, the first sub-pixel is a blue sub-pixel, the second sub-pixel is a red sub-pixel, and the third sub-pixel is a green sub-pixel.

In an embodiment of the present disclosure, the first sub-pixel, the second sub-pixel and the third sub-pixel are rectangular, an area of the first sub-pixel is greater than an area of the second sub-pixel and greater than an area of the third sub-pixel;

a first side of the first sub-pixel is parallel to a column in which the second sub-pixel and the third sub-pixel are arranged, and a second side of the first sub-pixel is perpendicular to the first side; and in the pixel definition layer, a region adjacent to the second side of the first sub-pixel is the first region, a region between two adjacent sub-pixels is the third region, and the other region is the second region.

In an embodiment of the present disclosure, adjacent sides of the second sub-pixel and the third sub-pixel are equal to each other in length.

In an embodiment of the present disclosure, a setting value of the first thickness is greater than or equal to 1.8 µm and less than or equal to 2.2 µm, a setting value of the second thickness is greater than or equal to 0.7 µm and less than or equal to 1.2 µm, and a setting value of the third thickness is greater than or equal to 0.1 µm and less than or equal to 0.3 µm.

In an embodiment of the present disclosure, a setting value of the first thickness is 2 µm, a setting value of the second thickness is 1µm, and a setting value of the third thickness is 0.1 µm.

According to a second aspect of the present disclosure, there is provided a method for manufacturing a display substrate, comprising:

forming a pixel definition layer of a pixel unit to surround a region for forming a light emitting layer, wherein the pixel definition layer comprises a first region and a second region, the first region has a first thickness, the second region has a second thickness, and the first thickness is greater than the second thickness; and forming the light emitting layer of the pixel unit by a vapor deposition, wherein a vapor deposition material is selectively shielded by the first region and the second region during the vapor deposition.

In an embodiment of the present disclosure, the pixel definition layer is formed using an ink jet printing process.

In an embodiment of the present disclosure, the pixel definition layer is formed using a photolithography with a gray scale mask.

In an embodiment of the present disclosure, the pixel unit comprises a first sub-pixel, a second sub-pixel, and a third sub-pixel, the first sub-pixel, the second sub-pixel and the third sub-pixel are rectangular; the second sub-pixel and the third sub-pixel are arranged in a same column; an area of the first sub-pixel is greater than an area of the second sub-pixel and greater than an area of the third sub-pixel; a first side of the first sub-pixel is parallel to the column in which the second sub-pixel and the third sub-pixel are arranged, and a second side of the first sub-pixel is perpendicular to the first side;

the pixel definition layer further comprises a third region located between two adjacent sub-pixels; and in the pixel definition layer, a region adjacent to the second side of the first sub-pixel is the first region, a region between two adjacent sub-pixels is the third region, and the other region is the second region; the third region has a third thickness, and the third thickness is less than the first thickness and less than the second thickness.

In an embodiment of the present disclosure, the step of forming the light emitting layer of the pixel unit by the vapor deposition comprises:

positioning the display substrate such that the display substrate is angled with respect to a horizontal plane by a first predetermined angle and located above a vapor deposition source and faces towards the vapor deposition source, wherein the second sub-pixel is located above the third sub-pixel;

forming a light emitting layer in the second sub-pixel by a vapor deposition, wherein the second region shields the third sub-pixel, and the first region shields the first sub-pixel;

turning over the display substrate such that the display substrate is angled with respect to the horizontal plane by a second predetermined angle and located above the vapor deposition source and faces towards the vapor deposition source, wherein the third sub-pixel is located above the second sub-pixel;

forming a light emitting layer in the third sub-pixel by a vapor deposition, wherein the second region shields the second sub-pixel, and the first region shields the first sub-pixel;

turning over the display substrate such that the display substrate is angled with respect to the horizontal plane by a third predetermined angle and located above the vapor deposition source and faces towards the vapor deposition source, wherein the first sub-pixel is located above the second sub-pixel and the third sub-pixel; and forming a light emitting layer in the first sub-pixel by a vapor deposition, wherein the second region shields the second sub-pixel and the third sub-pixel.

In an embodiment of the present disclosure, during the vapor deposition, two of four sides of each of the first sub-pixel, the second sub-pixel and the third sub-pixel are parallel to a horizontal direction, and the others are perpendicular to the horizontal direction;

the first predetermined angle=90°-arctan (the second thickness/a length of a side of the third sub-pixel perpendicular to the horizontal direction during the vapor deposition);

the second predetermined angle=90°-arctan (the second thickness/a length of a side of the second sub-pixel perpendicular to the horizontal direction during the vapor deposition); and the third predetermined angle=90°-arctan (the second thickness/a length of a side of the second sub-pixel or the third sub-pixel perpendicular to the horizontal direction during the vapor deposition).

In an embodiment of the present disclosure, during the vapor deposition, the display substrate is at a predetermined distance from the vapor deposition source.

In an embodiment of the present disclosure, the predetermined distance is 1 m.

According to a third aspect of the present disclosure, there is provided a display panel, comprising the above-described display substrate or the display substrate manufactured by the above-described method for manufacturing the display substrate.

According to a fourth aspect of the present disclosure, there is provided a display device, comprising the above-described display panel.

BRIEF DESCRIPTION OF THE DRAWINGS

In order to more clearly describe the technical solutions in the embodiments of the present disclosure, the accompanying drawings required for describing the embodiments will be briefly introduced. It will be appreciated that the accompanying drawings in the following description only represent a portion of embodiments of the present disclosure, rather than limiting the present disclosure. In the drawings.

DETAILED DESCRIPTION OF PREFERRED EMBODIMENTS

In order to make the technical solutions and advantages of the embodiments of the present disclosure more clear, the technical solutions in the embodiments of the present disclosure will be clearly and completely described below with reference to the accompanying drawings. It is apparent that the described embodiments only represent a portion of the present disclosure, rather than the entire contents of the present disclosure. All other embodiments obtained by those skilled in the art based on the described embodiments of the present disclosure without any creative efforts fall within the scope of the present disclosure.

An embodiment of the present disclosure provides a display substrate, including a plurality of pixel units, wherein the pixel unit includes a light emitting layer and a pixel definition layer surrounding the light emitting layer. The pixel definition layer includes a first region and a second region. The first region has a first thickness, the second region has a second thickness. The first thickness is greater than the second thickness.

The light emitting layer can be formed by a vapor deposition process. The pixel definition layer may be configured to shield a vapor deposition material during a vapor deposition to obtain the light emitting layer having a predetermined shape. The first region with a larger thickness can shield a larger area during the vapor deposition, and the second region with a smaller thickness can shield a smaller area during the vapor deposition. By means of the arrangement of different thicknesses, the shape of the light emitting layer can be controlled better.

The pixel unit may include a plurality of sub-pixels. The light emitting layer includes a plurality of portions respectively provided in the sub-pixels. The pixel definition layer further includes a third region located between two adjacent sub-pixels, the third region has a third thickness, and the third thickness is less than the first thickness and less than the second thickness.

When the vapor deposition is implemented, the first region, the second region and the third region are configured to shield the vapor deposition material during the vapor deposition to respectively form the portions of the light emitting layer. The third region between the two adjacent sub-pixels can effectively prevent the mixing of materials of light emitting layers of different sub-pixels.

Figure 1:
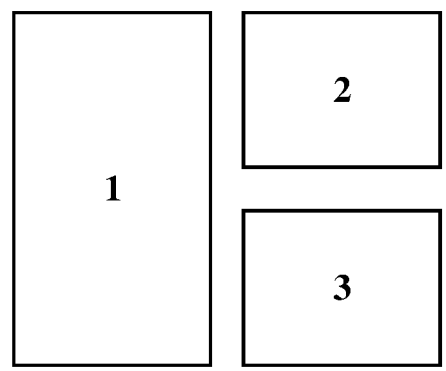
FIG. 1 is a schematic view of an arrangement structure of a pixel unit according to an embodiment of the present disclosure.

FIG. 1 is a schematic view of an arrangement structure of a pixel unit according to an embodiment of the present disclosure. In the arrangement structure of the pixel unit, the pixel unit includes a first sub-pixel 1, a second sub-pixel 2 and a third sub-pixel 3, which are rectangular. The first sub-pixel 1, the second sub-pixel 2 and the third sub-pixel 3 are arranged as shown in the figure. The first sub-pixel 1 is arranged in a column, and the second sub-pixel 2 and the third sub-pixel 3 are arranged in another column. An area of the first sub-pixel 1 is greater than an area of the second sub-pixel 2 and greater than an area of the third sub-pixel 3. The second sub-pixel 2 and the third sub-pixel 3 are arranged in a column and are parallel to a first side of the first sub-pixel 1, and a second side of the first sub-pixel 1 is perpendicular to the first side. In the pixel definition layer surrounding the light emitting layer, a region adjacent to the second side of the first sub-pixel 1 is the first region A1, a region between two adjacent sub-pixels is the third region A3, and the other region is the second region A2.

In an embodiment of the present disclosure, the first sub-pixel 1 is a blue sub-pixel B, the second sub-pixel 2 is a red sub-pixel R, and the third sub-pixel 3 is a green sub-pixel G.

According to the embodiment of the present disclosure, the area of the blue sub-pixel B is made relatively larger so that the intensity of the blue light can be ensured.

Figure 2:
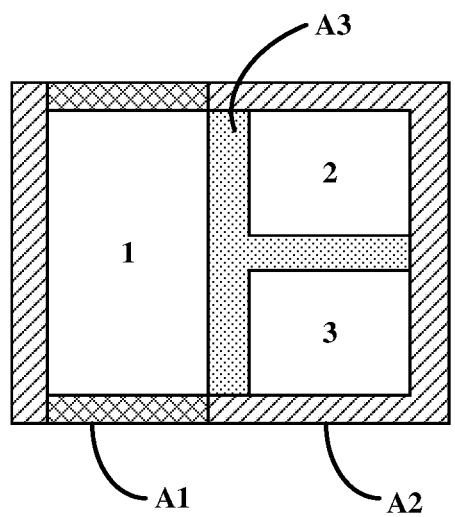
FIG. 2 is a schematic structural view of a pixel region of a display substrate according to an embodiment of the present disclosure.

FIG. 2 is a schematic structural view of a pixel region of a display substrate according to an embodiment of the present disclosure. The display substrate includes the arrangement structure of the pixel unit described above. As for the pixel definition layer for forming the light emitting layer, the thickness of the third region A3 (the portion of the pixel definition layer between two adjacent sub-pixels in the pixel unit) is the smallest, the thickness of the first region A1 (the portion of the pixel definition layer adjacent to the second side of the first sub-pixel 1) is the largest, and the thickness of the second region A2 (the remaining portion of the pixel definition layer surrounding the light emitting layer) is mediate.

In the embodiment of the present disclosure, when the thickness of the pixel definition layer is set, the following values may be determined: the thickness (the first thickness) of the first region A1 is greater than or equal to 1.8 μm and less than or equal to 2.2 μm, the thickness (the second thickness) of the second region A2 is greater than or equal to 0.7 μm and less than or equal to 1.2 μm, and the thickness (third thickness) of the third region A3 is greater than or equal to 0.1 μm and less than or equal to 0.3 μm.

In view of the actual machining accuracy and fine adjustment of the preset values, there will be an error between the actual thickness and the set thickness. For example, the first thickness has an error of ±0.3 μm, the second thickness has an error of ±0.15 μm, and the third thickness has an error of ±0.05 μm.

In an embodiment of the present disclosure, the first thickness may be 2 times the second thickness.

In the embodiment of the present disclosure, when the thickness of the pixel definition layer is set, the following values may be determined: the first thickness is 2 μm, the second thickness is 1 μm, and the third thickness is 0.1 μm.

Thus, in view of the actual machining accuracy and fine adjustment of the preset values, the actual thicknesses may be: the first thickness of 2±0.3 μm, the second thickness of 1±0.15 μm, and the third thickness of 0.1±0.05 μm.

Figure 3:
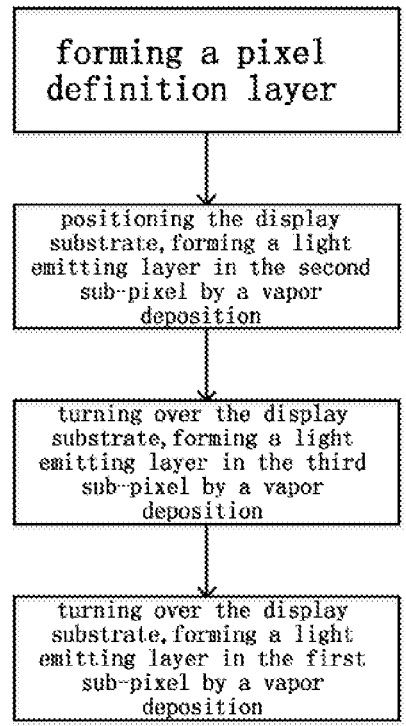
FIG. 3 is a flow chart of a method for manufacturing a display substrate according to an embodiment of the present disclosure.

FIG. 3 is a flow chart of a method for manufacturing a display substrate according to an embodiment of the present disclosure. This method which is used for manufacturing the display substrate described above includes steps of: forming a pixel definition layer; positioning a substrate and forming a second sub-pixel by a vapor deposition; turning over the substrate and forming a third sub-pixel by a vapor deposition; turning over the substrate and forming a first sub-pixel by a vapor deposition.

According to the method of the embodiment of the present disclosure, after the predetermined pixel definition layer is formed, the vapor deposition materials are shielded by the various regions with different thicknesses of the pixel definition layer during the vapor deposition, to obtain the respective sub-pixels at different positions. There is no need to use a mask, it thereby reduces costs and saves manufacturing time while ensuring accuracy.

In an embodiment of the present disclosure, the pixel definition layer PDL may be obtained using an etching process. After the deposition and patterning of a pixel layer (PXL) is completed on a glass substrate, a pixel definition layer PDL is coated and exposed to light and etched with a gray scale mask by photolithography so that different regions have different thicknesses. During the photolithography, more materials are removed at the location of the second region than at the location of the first region, and more materials are removed at the location of the third region than at the location of the second region. The thickness of the middle region of the pixel definition layer PDL between the sub-pixels of each pixel unit is 0.1 μm. The thicknesses of the region above the R and G regions, the region below the R and G regions and the region at the right side of the R and G regions are 1 μm, the thickness of the region of the left side of the B region is 1 μm, and the thickness of the region above the B region and the region below the B region are 2 μm. Then, the coating and patterning of post spacers (PS) can also be done. After that, the vapor deposition of EL materials of the light emitting layer can be implemented.

In an embodiment of the present disclosure, the pixel definition layer PDL can also be obtained by an ink jet printing process. In the ink jet printing process, more materials are sprayed at the location of the first region than at the location of the second region, and more materials are sprayed at the location of the second region than at the location of the third region.

Next, the vapor deposition process of each sub-pixel will be described in detail with reference to FIGS. 4 to 9.

Figure 4:
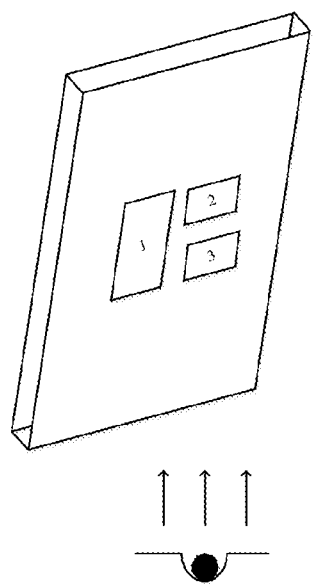
FIG. 4 is a schematic view showing a vapor deposition of a second sub-pixel shown in FIG. 1.
Figure 5:
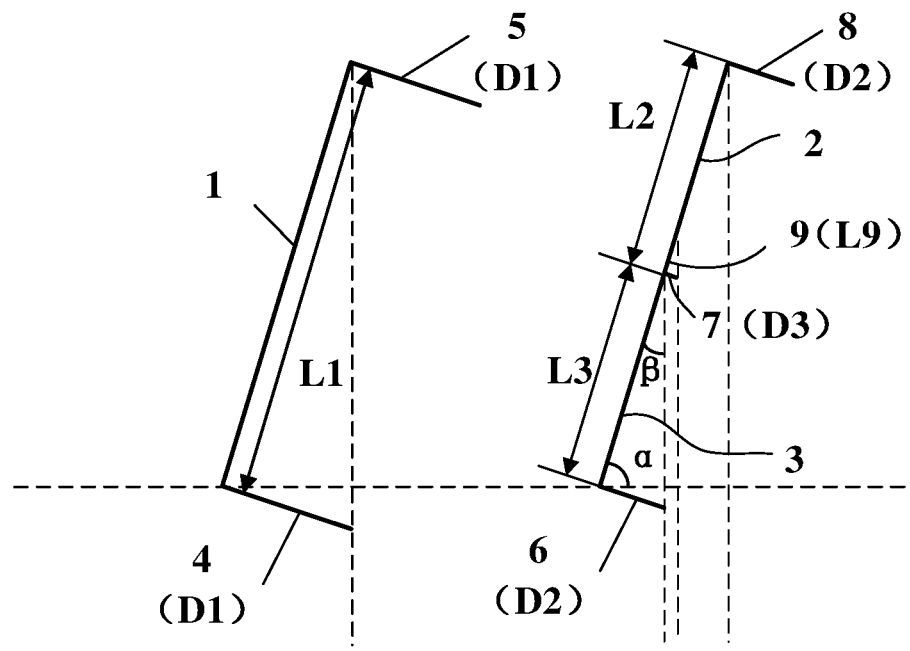
FIG. 5 is a schematic view showing position relationship of various parts shown in FIG. 4.

FIG. 4 is a schematic view showing a vapor deposition of the second sub-pixel shown in FIG. 1; and FIG. 5 is a schematic view showing position relationship of the various parts shown in FIG. 4.

Firstly, the display substrate is positioned such that a plane where the display substrate is located is angled with respect to a horizontal plane by a first predetermined angle α as shown in FIG. 5, and the display substrate is located above a vapor deposition source, faces towards the vapor deposition source and is at a predetermined distance from the vapor deposition source. The second sub-pixel is located above the third sub-pixel. The predetermined distance may be 1 m, and the predetermined distance may refer to a distance between a lower side of the display substrate and the vapor deposition source.

Two opposite sides of four sides of each of the first sub-pixel, the second sub-pixel and the third sub-pixel, which are parallel to a horizontal direction, are referred to as second sides in the present disclosure, and the other opposite sides which are perpendicular to the horizontal direction are referred to as first sides (please be noted that the first sides and the second sides are only used for simplicity of description herein).

Then, a vapor deposition is implemented in such a way that the second region of the pixel definition layer shields the third sub-pixel, and the first region shields the first sub-pixel.

As shown in FIG. 4 and FIG. 5, the vapor deposition materials are evaporated from the bottom to the top. Since the vapor deposition source is spaced apart from the display substrate by a certain distance, it is approximately considered as that the vapor deposition materials are vapor-deposited onto the display substrate in a vertical direction within an error range. After the display substrate to be vapor-deposited enters a vapor deposition chamber, the angle is adjusted so that the first region 4 of the pixel definition layer below the first sub-pixel 1 shields the first sub-pixel 1 and the second region 6 of the pixel definition layer below the third sub-pixel 3 shields the third sub-pixel 3. As a result, the vapor deposition materials are not vapor-deposited on the first sub-pixel 1 and the third sub-pixel 3. The first region 5 of the pixel definition layer above the first sub-pixel 1 and the second region 8 of the pixel definition layer above the second sub-pixel 2 are respectively used for shielding the first sub-pixel 1 and the third sub-pixel 3 of adjacent pixel units.

In addition, due to the shielding of the third region 7 of the pixel definition layer between the second sub-pixel 2 and the third sub-pixel 3, a blank region 9 is formed below the second sub-pixel 2. The blank region 9 can further prevent color mixing without affecting the light emitting effect of the pixel unit.

In FIG. 5, L1 is a length of the first side of the first sub-pixel 1, L2 is a preset length of the first side of the second sub-pixel 2, L3 is a preset length of the first side of the third sub-pixel 3 (the length of the side perpendicular to the horizontal direction during the vapor deposition). L2 may be equal to L3. D1 is a thickness of the pixel definition layers 4, 5 adjacent to the second side of the first sub-pixel 1 (i.e., the first thickness of the first region A1), D2 is a thickness of the pixel definition layer 6 below the third sub-pixel 3 or a thickness of the pixel definition layer 8 above the sub-pixel 2 (i.e., the second thickness of the second region A2), D3 is a thickness of the pixel definition layer 7 between the second sub-pixel 2 and the third sub-pixel 3 (i.e., the thickness of third region A3).

If there is no third region A3, then the vapor deposition materials of the second sub-pixel 2 can be vapor-deposited on the whole length indicated by L2 in the figure. Since the third region A3 is provided, a portion of the vapor deposition materials are shielded, a blank region 9 is generated, wherein L9 is a length of the blank region 9.

The angle between the plane where the display substrate is located and the horizontal plane is α, and the angle between the plane where the display substrate is located and the vertical direction is β. These angles have a fixed relationship with the thickness of the pixel definition layer and the length of the pixel region. The relationship can be expressed as follows: $\alpha=90°-\beta=90°-\arctan(D2/L3)=90°-\arctan(D3/L9)$, where L9=2 μm, $\alpha=90°-\arctan 0.05$ when L1=40 μm, L2=L3=20 μm, D1=2 μm, D2=1 μm, and D3=0.1 μm. That is, as shown in FIGS. 4 and 5, α is related to the second thickness and the length of the side of the third sub-pixel 3 parallel to an extending direction of the first sub-pixel 1.

Figure 6:
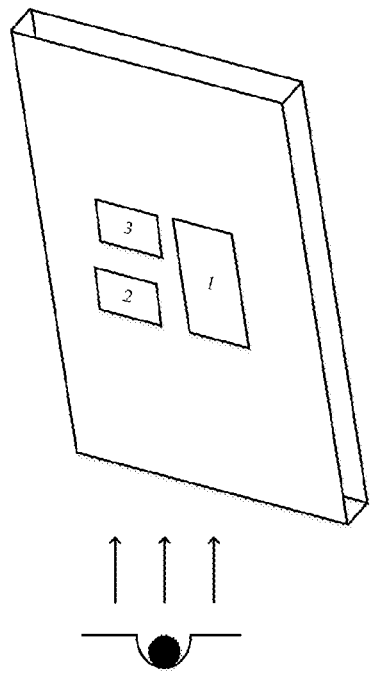
FIG. 6 is a schematic view showing a vapor deposition of a third sub-pixel shown in FIG. 1.

FIG. 6 is a schematic view showing a vapor deposition of the third sub-pixel shown in FIG. 1. When the third sub-pixel is vapor-deposited, the display substrate is firstly turned over such that the display substrate is angled with respect to the horizontal plane by a second predetermined angle, and the display substrate is located above the vapor deposition source, faces towards the vapor deposition source and is at a predetermined distance from the vapor deposition source. The third sub-pixel is located above the second sub-pixel. Then, a vapor deposition is implemented. In this case, the second region shields the second sub-pixel, and the first region shields the first sub-pixel.

Figure 7:
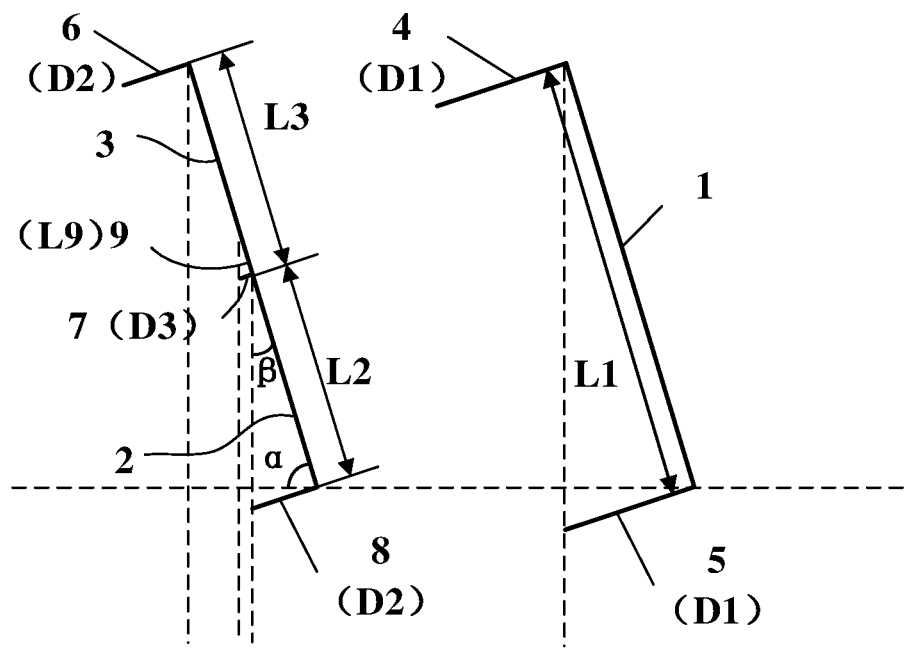
FIG. 7 is a schematic view showing position relationship of various parts shown in FIG. 6.

FIG. 7 is a schematic view showing position relationship of the various parts shown in FIG. 6. As shown in FIG. 5 and FIG. 7, as an example, the thicknesses of the pixel definition layer 6 and the pixel definition layer 8 are set to be the same, and L2 may be equal to L3. After the turning, the angle between the plane where the display substrate is located and the horizontal direction is still α, the angle between the plane where the display substrate is located and the vertical direction is still β. Except that the third sub-pixel is located above the second sub-pixel, the other positional relationships are exactly the same as those shown in FIG. 5. Such an arrangement can simplify the vapor deposition process. Similarly, D1 is set to be twice of D2, L1 is twice of L2 or L3, and L1 is equal to the sum of L2 and L3. In this way, it can further simplify the vapor deposition process and also simplify the manufacturing processes of the entire pixel definition layer. In addition, the lengths of the adjacent sides of the second sub-pixel 2 and the third sub-pixel 3 can be equal to each other, so as to simplify the process and improve the efficiency.

It should be understood that the above relationships may be modified. For example, if the second sub-pixel 2 and the third sub-pixel 3 have different shapes, it may be required that L2 is not equal to L3, which can be easily achieved by changing the thicknesses of the pixel definition layer 6 and the pixel definition layer 8. For example, referring to FIG. 7, if the thickness of the pixel definition layer 8 is increased, then more vapor deposition materials can be shielded, so that L3 becomes smaller than L2. Similarly, L1 may also not be equal to the sum of L2 and L3. That is, in various regions of the pixel definition layer, the values of the thicknesses of the different positions can be further adjusted and set to be different. Therefore, various values or relationships listed as examples in the above-described embodiments may be adjusted according to actual application environments.

Figure 8:
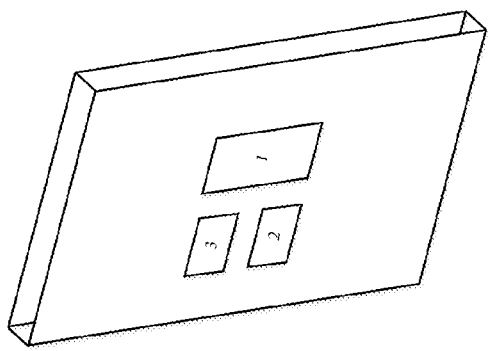
FIG. 8 is a schematic view showing a vapor deposition of a first sub-pixel shown in FIG. 1.
Figure 8:
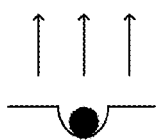
Figure 9:
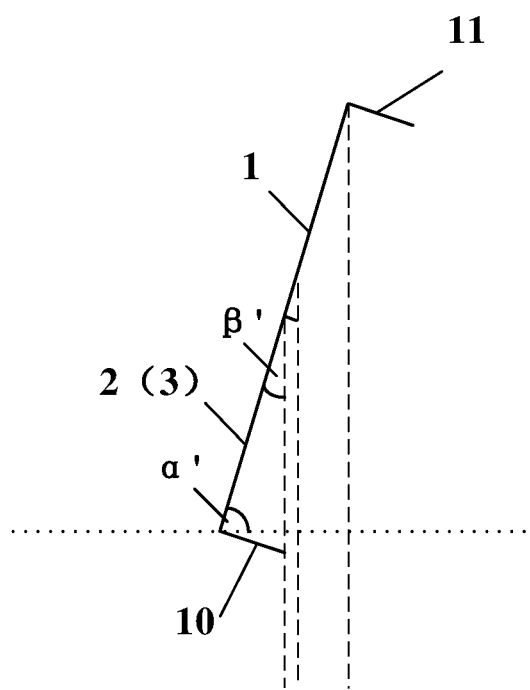
FIG. 9 is a schematic view showing position relationship of various parts shown in FIG. 8.

FIG. 8 is a schematic view showing a vapor deposition of the first sub-pixel shown in FIG. 1; and FIG. 9 is a schematic view showing position relationship of the various parts shown in FIG. 8. As shown in FIG. 8 and FIG. 9, the display substrate is turned over such that the display substrate is angled with respect to the horizontal plane by a third predetermined angle α' as shown in FIG. 9, and the display substrate is located above the vapor deposition source, faces towards the vapor deposition source and is at a predetermined distance from the vapor deposition source. The first sub-pixel is located above the second sub-pixel and the third sub-pixel. The light emitting layer in the first sub-pixel is vapor-deposited, wherein the second region shields the second sub-pixel and the third sub-pixel. The third predetermined angle may also be $\alpha'=90°-\beta'=90°$-arctan (the second thickness/the length of the side of the third sub-pixel perpendicular to the horizontal direction during the vapor deposition). Alternatively, $\alpha'=90°-\beta'=90°$-arctan (the second thickness/the length of the side of the second sub-pixel perpendicular to the horizontal direction during the vapor deposition). That is, as shown in FIGS. 8 and 9, $\alpha'$ is related to the second thickness and the length of the side of the third sub-pixel 3 perpendicular to the extending direction of the first sub-pixel 1.

As an example, if the second sub-pixel 2 and the third sub-pixel 3 are square, $\alpha$ in FIG. 5 or FIG. 7 may be equal to $\alpha'$ in FIG. 9.

In an embodiment of the present disclosure, the display substrate may be rotated about an axis perpendicular to the display substrate by 90° so that the vapor-deposited second sub-pixel 2 and the vapor-deposited third sub-pixel 3 are located in a vapor deposition shaded area or a shielded area, thereby completing the vapor deposition of the first sub-pixel 1. The second region 10 of the pixel definition layer adjacent to the second sub-pixel 2 and the third sub-pixel 3 shields the second sub-pixel 2 and the third sub-pixel 3 during the vapor deposition process. The second region 11 of the pixel definition layer adjacent to the first sub-pixel 1 shields the second sub-pixel 2 and the third sub-pixel 3 of the adjacent pixel units.

According to the embodiments of the present disclosure, the high-precision vapor deposition process is completed in combination with the arrangement structure of the pixel unit, the thickness distribution of the pixel definition layer PDL and the form of rotation deposition. This process can omit the fine metal mask FMM. Therefore, to a large extent, the cost and difficulty for manufacturing the products can be saved or reduced, the accuracy can be improved and the color mixing can be reduced. The embodiments of the present disclosure are applicable to products that require a vapor deposition process, for example, organic light emitting diode (OLED) products, including low-temperature polysilicon active matrix organic light emitting diode (LTPS AMOLED) products that adopt a low-temperature polysilicon technology widely used in recent years.

According to an embodiment of the present disclosure, there is provided a display panel including the above-described display substrate.

According to an embodiment of the present disclosure, there is provided a display device including the above-described display panel. The display device may be any product or component having a display function, such as a mobile phone, a tablet computer, a television, a display, a notebook computer, a digital photo frame, a navigator and the like.

In the display substrate, the method for manufacturing the display substrate, the display panel and the display device according to the embodiments of the present disclosure, it is possible to perform a vapor deposition of multiple colors of light emitting materials without using a fine metal mask, and ensure relatively high vapor deposition accuracy (for example, 3 μm) while maintaining a relatively low production cost.

It should be understood that the above embodiments are merely exemplary embodiments for illustrating the principle of the present disclosure, but the present disclosure is not limited thereto. Various modifications and improvements may be made by those skilled in the art without departing from the spirit of the present disclosure, and these modifications and improvements fall within the scope of the present disclosure.

What is claimed is:

1. A display substrate, comprising a pixel unit having a plurality of sub-pixels, wherein the pixel unit comprises
    a light emitting layer and a pixel definition layer surrounding the light emitting layer,
    wherein the pixel definition layer comprises a first region and a second region, the first region has a first thickness, the second region has a second thickness, and the first thickness is greater than the second thickness,
    wherein the pixel definition layer further comprises a third region located between two adjacent sub-pixels, the third region has a third thickness, and the third thickness is less than the first thickness and less than the second thickness,
    wherein the pixel unit comprises a first sub-pixel, a second sub-pixel and a third sub-pixel, the first sub-pixel is arranged in a first column, and the second sub-pixel and the third sub-pixel are arranged in a second column, and
    wherein the first sub-pixel, the second sub-pixel and the third sub-pixel are rectangular, an area of the first sub-pixel is greater than an area of the second sub-pixel and greater than an area of the third sub-pixel; a first side of the first sub-pixel is parallel to the second column in which the second sub-pixel and the third sub-pixel are arranged, and a second side of the first sub-pixel is perpendicular to the first side; and in the pixel definition layer, a region adjacent to the second side of the first sub-pixel is the first region, a region between two adjacent sub-pixels is the third region, and a remaining region is the second region.

2. The display substrate according to claim 1, wherein the first region and the second region are configured to selectively shield a vapor deposition material during formation of the light emitting layer by a vapor deposition process so that the light emitting layer has a predetermined shape.

3. The display substrate according to claim 1, wherein the light emitting layer comprises a plurality of portions respectively provided in the plurality of sub-pixels.

4. The display substrate according to claim 3, wherein the first region, the second region and the third region are configured to selectively shield a vapor deposition material during formation of the light emitting layer by a vapor deposition process, to respectively form the portions of the light emitting layer.

5. The display substrate according to claim 1, wherein the first sub-pixel is a blue sub-pixel, the second sub-pixel is a red sub-pixel, and the third sub-pixel is a green sub-pixel.

6. The display substrate according to claim 1, wherein adjacent sides of the second sub-pixel and the third sub-pixel are equal to each other in length.

7. The display substrate according to claim 1, wherein a setting value of the first thickness is greater than or equal to 1.8 μm and less than or equal to 2.2 μm, a setting value of the second thickness is greater than or equal to 0.7 μm and less than or equal to 1.2 μm, and a setting value of the third thickness is greater than or equal to 0.1 μm and less than or equal to 0.3 μm.

8. The display substrate according to claim 7, wherein a setting value of the first thickness is 2 μm, a setting value of the second thickness is 1 μm, and a setting value of the third thickness is 0.1 μm.

9. A method for manufacturing a display substrate, comprising:
forming a pixel definition layer of a pixel unit to surround a region for forming a light emitting layer, wherein the pixel definition layer comprises a first region and a second region, the first region has a first thickness, the second region has a second thickness, and the first thickness is greater than the second thickness; and
forming the light emitting layer of the pixel unit by a vapor deposition, wherein a vapor deposition material is selectively shielded by the first region and the second region during the vapor deposition,
wherein the pixel unit comprises a first sub-pixel, a second sub-pixel, and a third sub-pixel, the first sub-pixel, the second sub-pixel and the third sub-pixel are rectangular; the second sub-pixel and the third sub-pixel are arranged in a same column; an area of the first sub-pixel is greater than an area of the second sub-pixel and greater than an area of the third sub-pixel; a first side of the first sub-pixel is parallel to the column in which the second sub-pixel and the third sub-pixel are arranged, and a second side of the first sub-pixel is perpendicular to the first side; the pixel definition layer further comprises a third region located between two adjacent sub-pixels; in the pixel definition layer, a region adjacent to the second side of the first sub-pixel is the first region, a region between two adjacent sub-pixels is the third region, and a remaining region is the second region; and the third region has a third thickness, and the third thickness is less than the first thickness and less than the second thickness.

10. The method according to claim 9, wherein the pixel definition layer is formed using an ink jet printing process.

11. The method according to claim 9, wherein the step of forming the light emitting layer of the pixel unit by the vapor deposition comprises:
positioning the display substrate such that the display substrate is angled with respect to a horizontal plane by a first predetermined angle and located above a vapor deposition source and faces towards the vapor deposition source, wherein the second sub-pixel is located above the third sub-pixel;
forming a light emitting layer in the second sub-pixel by a vapor deposition, wherein the second region shields the third sub-pixel, and the first region shields the first sub-pixel;
turning over the display substrate such that the display substrate is angled with respect to the horizontal plane by a second predetermined angle and located above the vapor deposition source and faces towards the vapor deposition source, wherein the third sub-pixel is located above the second sub-pixel;
forming a light emitting layer in the third sub-pixel by a vapor deposition, wherein the second region shields the second sub-pixel, and the first region shields the first sub-pixel;
turning over the display substrate such that the display substrate is angled with respect to the horizontal plane by a third predetermined angle and located above the vapor deposition source and faces towards the vapor deposition source, wherein the first sub-pixel is located above the second sub-pixel and the third sub-pixel; and
forming a light emitting layer in the first sub-pixel by a vapor deposition, wherein the second region shields the second sub-pixel and the third sub-pixel.

12. The method according to claim 11, wherein,
during the vapor deposition, two of four sides of each of the first sub-pixel, the second sub-pixel and the third sub-pixel are parallel to a horizontal direction, and the other sides are perpendicular to the horizontal direction;
the first predetermined angle=90°-arctan (the second thickness/a length of a side of the third sub-pixel perpendicular to the horizontal direction during the vapor deposition);
the second predetermined angle=90°-arctan (the second thickness/a length of a side of the second sub-pixel perpendicular to the horizontal direction during the vapor deposition); and
the third predetermined angle=90°-arctan (the second thickness/a length of a side of the second sub-pixel or the third sub-pixel perpendicular to the horizontal direction during the vapor deposition).

13. The method according to claim 11, wherein, during the vapor deposition, the display substrate is at a predetermined distance from the vapor deposition source.

14. The method according to claim 13, wherein the predetermined distance is 1 m.

15. A display panel, comprising the display substrate according claim 1.

16. A display device, comprising the display panel according to claim 15.

17. The method according to claim 9, wherein the pixel definition layer is formed using a photolithography with a gray scale mask.

* * * * *